United States Patent [19]
Hughes

[11] Patent Number: 6,154,031
[45] Date of Patent: Nov. 28, 2000

[54] GRADIENT DRIVE SYSTEM FOR MAGNETIC RESONANCE IMAGING

[75] Inventor: Raymond Leonard Hughes, Harpenden, United Kingdom

[73] Assignee: BTG International Limited, London, United Kingdom

[21] Appl. No.: 09/397,144

[22] Filed: Sep. 16, 1999

Related U.S. Application Data

[63] Continuation of application No. PCT/GB98/00764, Mar. 13, 1998.

[30] Foreign Application Priority Data

Mar. 17, 1997 [GB] United Kingdom ............ 9705459

[51] Int. Cl.[7] .................................................. G01R 33/20
[52] U.S. Cl. ............................................ 324/322; 324/318
[58] Field of Search ......................................... 324/300–322

[56] References Cited

U.S. PATENT DOCUMENTS

| | | | |
|---|---|---|---|
| 4,422,032 | 12/1983 | Kakuoto et al. ............................ | 320/39 |
| 4,733,342 | 3/1988 | Mueller et al. ............................ | 363/132 |
| 4,875,486 | 10/1989 | Rapoport et al. .......................... | 600/415 |
| 5,017,871 | 5/1991 | Mueller et al. ............................ | 324/318 |
| 5,245,288 | 9/1993 | Leussler ..................................... | 324/322 |
| 5,270,657 | 12/1993 | Wirth et al. ................................ | 324/318 |
| 5,311,136 | 5/1994 | Takahashi .................................. | 324/322 |

FOREIGN PATENT DOCUMENTS

| | | |
|---|---|---|
| 250718 | 1/1988 | Germany . |
| 418074 | 12/1991 | United Kingdom . |
| 0562791 | 12/1993 | United Kingdom . |

OTHER PUBLICATIONS

Patent Abstracts of Japan, Pub No. 02034150, "Power Unit for Magnetic Resonance Imaging Device".

APEC '93, pp. 806–812, "A High–Efficiency 4–Switch GTO Speed–Up Inverter for the Generation of Fast–Changing MRI Gradient Fields", O. M. Mueller, J. N. Park, P.B. Roemer, S. P. Souza.

*Primary Examiner*—Jay Patidar
*Assistant Examiner*—Tiffany A. Fetzner
*Attorney, Agent, or Firm*—Nixon & Vanderhye

[57] ABSTRACT

A gradient drive system for delivering current pulses to an MRI gradient coil, having an input for receiving an relatively high voltage supply for the gradient coil, a relatively low voltage battery supply for the gradient coil and a controller coupled to the input for controlling the high voltage supply dependent on the current supply to the gradient coil.

31 Claims, 6 Drawing Sheets

GRADIENT DRIVE SYSTEM FOR MAGNETIC RESONANCE IMAGING

This is a continuation of PCT/GB98/00764 filed Mar. 13, 1998, now abandoned.

The present invention relates to a gradient drive system in particular for magnetic resonance imaging (MRI), and more especially to a system for generating and controlling the current pulses required by the gradient field coils used in magnetic resonance imaging.

BACKGROUND OF THE INVENTION

The basis of modern MRI systems is a magnet whose field has superimposed upon it gradient magnetic fields typically in X Y Z co-ordinates for spatial resolution, in an imaging volume. The coils for generating these gradient fields are energised by pulses of electric current which may comprise a rapid rise, then a flat top and then a rapid fall, followed by a reversal, after which the cycle repeats. The amplitude of the current pulses depends upon the strength of the gradient field required in the imaging volume together with the associated efficiency of the coil design. In addition the rise and fall time of the current pulses will depend upon the inductance of the gradient coil and the voltage available to drive the current during the ramp. With existing coil designs for whole body imaging, currents in the range of 100–300 amps (and most typically in the region of 300 amps) are generally required at voltages up to 300V depending on the rise-time required. For very fast imaging these voltages and currents may be significantly higher. At present most MRI systems achieve this using linear power amplifiers, an example being those manufactured by the Techron Corporation.

Such an amplifier is essentially a modified form of a linear, high power audio amplifier and is able to deliver peak currents of 150 amps at a maximum voltage of +/−150V with a bandwidth of DC-50 KHz. These amplifiers can be paralleled to increase their current capability and wired in a series or bridge arrangement to increase the output voltage swing, although combining amplifiers in this way adds considerably to cost and complexity. Each amplifier must also be powered from a three-phase mains supply and when driven at full power can demand high peak currents from the mains, presenting a poor power factor to the public electricity supply. If these amplifiers are powered from a diesel generator for mobile use then a special design of alternator and voltage regulator is required in order to cope with the current pulses demanded. At present rates (1997) each amplifier costs £4500 and so to achieve a gradient drive of 300 A/300V for one axis four amplifiers would be required at a cost of £18000. For all three axes this would total £54000.

Two different systems using high power amplifiers such as the Techron are described in EP-A-0460894 and EP-A-0460895. Both specifications describe circuits intended to speed up the rise and fall times of the current pulses needed to generate the gradient magnetic fields in MRI systems; in particular the rise-time of the current pulse is improved by switching in a separate high voltage supply to the coil during the ramp via a switching bridge. This has been designed as a retrofit to existing amplifier systems in order to improve their performance particularly for high-speed imaging, but nevertheless adds to cost and complexity.

DESCRIPTION OF THE INVENTION

The present invention seeks to provide a simple, low-cost gradient drive system able to meet the requirements of high-speed imaging but without the use of commercial linear amplifiers of the type described above.

The present invention therefore provides a gradient drive system for a gradient coil, comprising:
  an input for receiving a relatively high voltage supply for the gradient coil;
  a relatively low voltage battery supply for the gradient coil; and
  means coupled to said input for controlling the high voltage supply.

Preferably, the battery supply comprises at least one rechargeable battery.

Preferably, the high voltage supply controlling means is adapted to control the high voltage supply dependent on the current supplied to the gradient coil (and in particular dependent on the difference between that current and a desired current flow).

Preferably, the gradient drive system further comprises current supply control circuitry, coupled to the battery supply and the high voltage supply controlling means, for controlling supply of current to the gradient coil in response to control signals representing desired current flow through the gradient coil.

Preferably, the gradient drive system farther comprises control signal generating means for generating said control signals representing the desired current flow through the gradient coil.

Preferably, said high voltage supply controlling means comprises voltage supply control circuitry for controlling the connection of said high voltage supply to said current supply control circuitry so that said high voltage supply is isolated from said current supply control circuitry when the supply of current from said current supply control circuitry is substantially equal to the desired current flow.

The present invention also provides a gradient drive system comprising
  a relatively high voltage supply;
  control signal generating means for generating control signals representing desired current flow through a gradient coil;
  current supply control circuitry connected to said control signal generating means for controlling supply of current to the gradient coil in response to said control signals;
  a relatively low voltage battery supply connected to said current supply control circuitry; and
  voltage supply control circuitry connected to said high voltage supply for controlling the connection of said high voltage supply to said current supply control circuitry whereby said high voltage supply is (electrically) isolated from said current supply control circuitry when the supply of current from said current supply control circuitry is substantially equal to the desired current flow.

As used herein, the term "relatively high voltage supply" has a broad meaning to include any means capable of supplying a relatively high voltage, even if that means requires connection to an external power source in order actually to supply the voltage.

Thus, the use of commercial linear high power amplifiers can be obviated since the high voltage supply is used only to ramp the current flow through the gradient coil and once ramped the current flow is maintained by the low voltage battery supply.

It is worth noting that in many countries there are restrictions as to how much load to the mains supply an electricity consuming device may present in order to keep the power factor as high as possible. When using batteries to maintain the current flow the load of the gradient drive to the mains supply is insignificant.

Preferably, the current supply control circuitry is in the form of a four arm bridge circuit for connection across the gradient coil with one or more current regulators for sensing the flow of current through the gradient coil and for determining whether the sensed current flow corresponds to the desired current flow.

Also, the voltage supply control circuitry may include an error detector for determining when the flow of current through a gradient coil is not substantially equal to a desired current flow and a switching device for connecting the high voltage supply to the current supply control circuitry when a difference is detected. The voltage supply control circuitry may also include means for isolating the low voltage battery supply from the current supply control circuitry so that the low voltage battery supply may be protected from the high voltage supply. Hence also, preferably, the gradient drive system comprises means for isolating the battery supply from the high voltage supply.

The present invention further preferably provides a gradient drive system comprising
   a high voltage supply;
   a gradient coil;
   control signal generating means for generating control signals representing desired current flow through said gradient coil;
   current supply control circuitry connected to said control signal generating means and said gradient coil for controlling supply of current to said gradient coil in response to said control signals;
   a low voltage battery supply; and
   voltage supply control circuitry connected to said high voltage supply and said low voltage battery supply for controlling the connection of said voltage supplies to said current supply control circuitry whereby when the current flowing through said gradient coil is substantially equal to the desired current flow only said low voltage battery supply is connected to said current supply control circuitry.

With the invention, instead of the power amplifiers, a battery pack is used to supply current during the flat top of the current pulse and means are provided for controlling the output of the battery pack.

Typically the battery pack will be a plurality of rechargeable batteries connected in series and/or parallel sufficient to supply the required current and voltage during the flat top of the current pulse.

Means are also provided for giving a rapidly rising and falling edge to each current pulse. In a preferred embodiment a capacitor-discharge circuit is used to provide a high aiming voltage, and hence a rapid rise time, during the ramp.

The controlling means is preferably a current regulator connected in series with the battery output and regulated by negative feedback to follow an input reference waveform having a desired pulse shape. The gradient field coil is connected to the batteries via a current reversal means which causes the desired cyclic reversal of the current. Preferably the current reversal means is likewise controlled by said reference waveform.

Different waveforms can be used to control the gradient drive system such as trapezoidal or sinusoidal waveforms.

According to a further closely related aspect of the present invention, there is provided a gradient drive system for a gradient coil, comprising:
   an input for receiving a power supply for the gradient coil; and
   means coupled to said input for reversing the supply of current to the gradient coil;
   wherein said current reversal means comprises a four arm bridge circuit for connection across the gradient coil, said bridge circuit comprising two switches, and two respective current regulators for regulating the flow of current through the gradient coil.

Preferably, the switches are semiconductor devices and each of said current regulators also includes at least one semiconductor device.

Alternatively, the switches may be IGBTs and each of said current regulators also may include at least one IGBT.

Preferably, each current regulator comprises a current controlling device, a resistive element and an error amplifier, the error amplifier being arranged to compare the current through the gradient coil as a measure of the voltage across said resistive element with a desired current flow through the gradient coil and to generate an error output when a difference is determined, the current controlling device being arranged to control the flow of current through the gradient coil dependent on the error output.

Preferably, a first terminal of each switch is coupled to a first terminal of the input and a first terminal of each current regulator is coupled to a second terminal of the input, and a second terminal of each switch is coupled to a second terminal of its respective current regulator as well as being for coupling to a respective terminal of the gradient coil.

Preferably, the gradient drive system further comprises means for storing electrical energy recovered from the gradient coil.

The gradient drive system may further comprise the gradient coil. The gradient coil may be connected to said current supply control circuitry.

BRIEF DESCRIPTION OF THE DRAWINGS

In order that the invention may be better understood two embodiments thereof will now be described by way of example only and with reference to the accompanying drawings, in which.

DETAILED DESCRIPTION OF PREFERRED EMBODIMENTS

Figure 1:
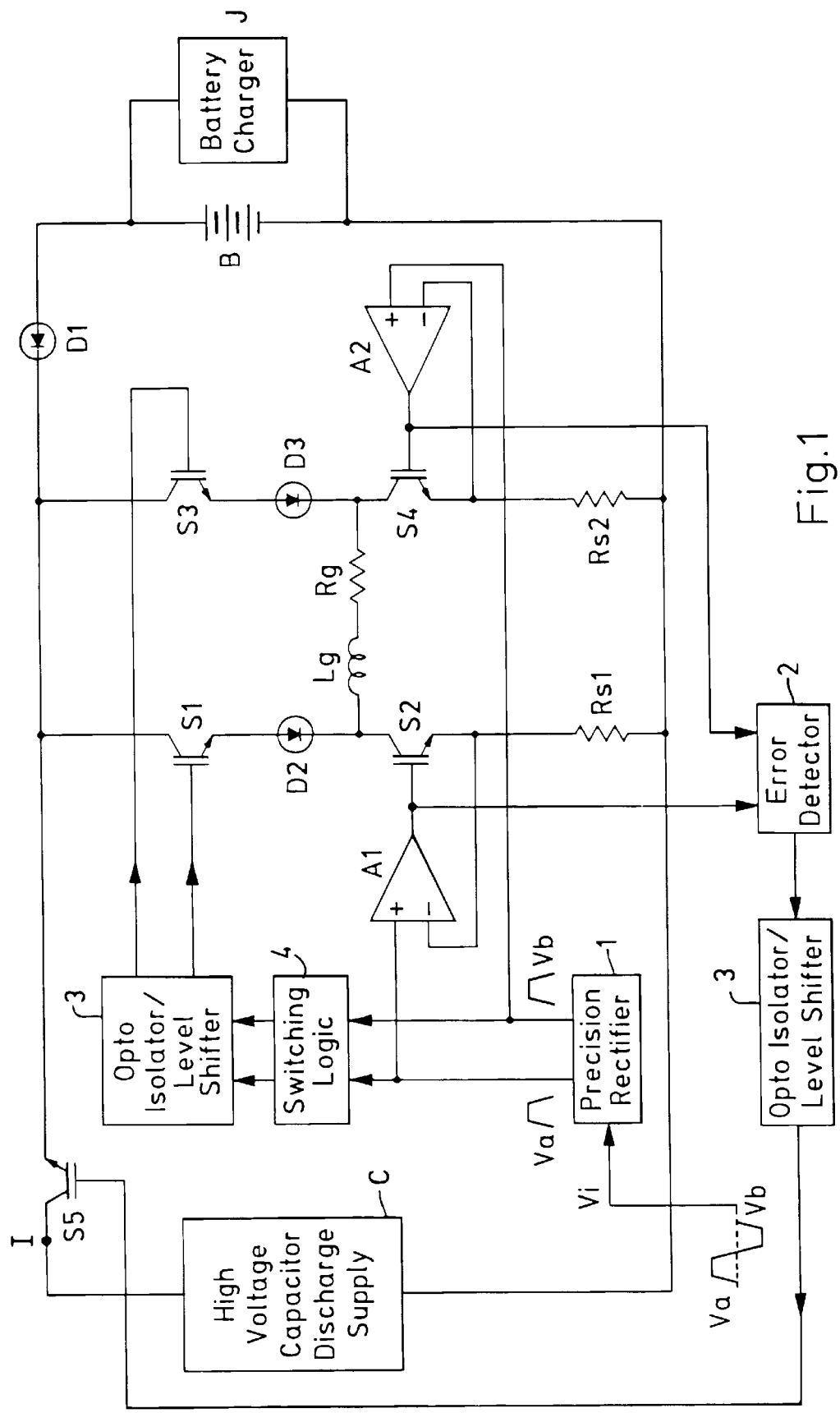
FIG. 1 is a block diagram of a first embodiment of a gradient drive system according to the invention.

In FIG. 1, the gradient coil for one axis (X, Y or Z) is represented as inductance Lg, and resistance Rg. The circuitry includes diodes D1, D2 and D3, as well as node I. Current for the drive pulses is supplied from two sources: from a battery pack B and battery charger J and a battery charger J which primarily supplies current for the flat top of the current pulses, and from a high voltage capacitor-discharge supply C which may derive its energy from an ac mains supply. Typically the output voltage of the high voltage supply C will be 350V.

Current is supplied to the gradient coil via a current reversal means comprising a four arm bridge composed of switches S1 and S3 and current controlling devices S2 and S4 all of which may be in the form of semiconductor devices implemented, for example, using insulated-gate bipolar transistors (IGBT), or power MOSFETs. As will be explained, the bridge enables bipolar current to flow through the coil from a unipolar current source, and also acts as a linear regulator for current in the coil.

Connected within the current reversal bridge is a current regulator comprising a current controlling device S2 connected in series with a current sense resistor Rs1. Current controlling device S4 connected to amplifier A2 and current sense resistor Rs2 form the current regulator in the other arm of the bridge. The current controlling device S2 controls current flow through the gradient coil by sensing the current flow through the coil as a measure of the voltage across resistor Rs1. This voltage is applied to one input of an error amplifier circuit A1, the other input of which is supplied by a control voltage signal Va from a precision rectifier 1. The output of the error amplifier circuit A1 is thus an error signal which is passed to the controlling gate of the current controlling device S2 and also to an error detector 2 which in turn, via an opto-isolator and level shifting circuitry 3, controls a voltage controlling device S5 connected between the output of the high voltage supply C and the current reversal circuit. Voltage controlling device S5 essentially operates in a linear mode (as opposed to in a switch mode). Voltage controlling device S5 may likewise be an IGBT. Point I as shown in FIG. 1 denotes an input of the device S5, that input being for receiving the high voltage supply.

Figure 5:
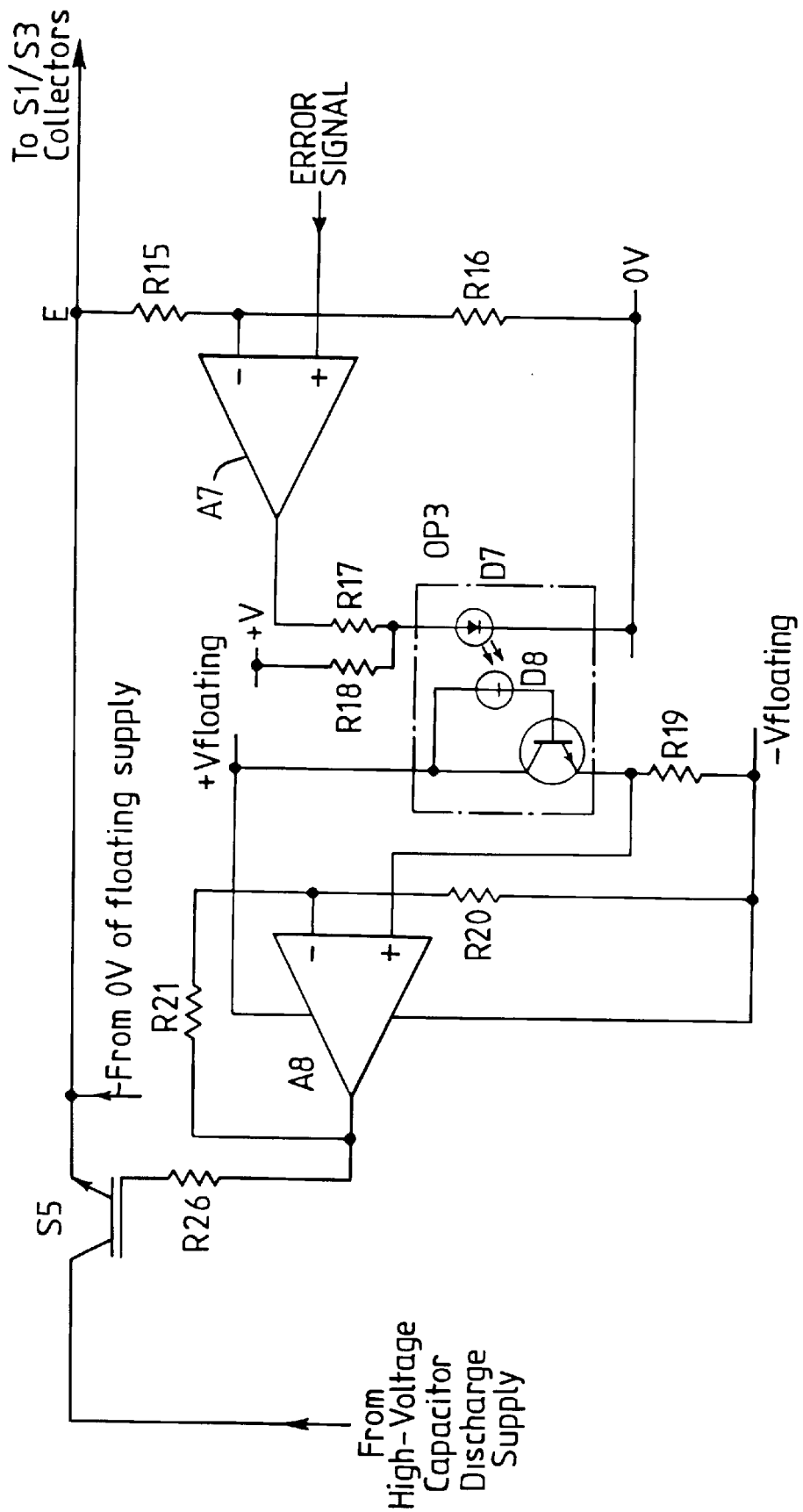
FIG. 5 is a circuit diagram for the opto-isolator and level shifting circuitry for switch S5 of FIG. 1.

The opto-isolator/level shifter for the voltage controlling device S5 is shown in FIG. 5. The circuitry includes resistor R26 and diodes D7 and D8. It operates essentially as a linear high-voltage amplifier in a closed loop formed by amplifier A7, linear opto-isolator OP3, amplifier A8 and voltage controlling device S5. A positive error signal from A1 or A2, through the error detector, is applied to the positive input of operational amplifier A7 causing the output of the amplifier to go positive. This increases the current through the l.e.d. of OP3 via R17 in addition to the current supplied by R18 which biases the l.e.d. in the linear part of its characteristic. The resultant optical coupling causes an increase in the current through the transistor of OP3 which in turn increases the voltage across R19. This rise in voltage is applied to the positive input of power operational amplifier A8 which causes its output to rise by an amount determined by the gain setting resistors R20 and R21. The voltage from A8 turns on voltage controlling device S5 which causes a large increase in the voltage (up to several hundred volts) at node E (the source of this voltage being the high-voltage capacitor discharge supply). Resistors R15 and R16 divide this voltage down so that the voltage on the negative input of A7 equals the error signal on the positive input. R15 and R16 therefore set the overall closed loop voltage gain of the amplifier. Typically a 5V error signal would require a gain of 60 to give an output of 300 V. The power for A8 and the output stage of OP3 is derived from an isolated power supply (+Vfloating, −Vfloating) which is able to reference itself to the voltage at node E.

If small current errors are present at the control input of S5 these are in general not large enough to turn on S5 sufficiently to overcome the battery voltage of 48V. Therefore during the flat top region of the cycle the high voltage supply is unlikely to be used.

Figure 2:
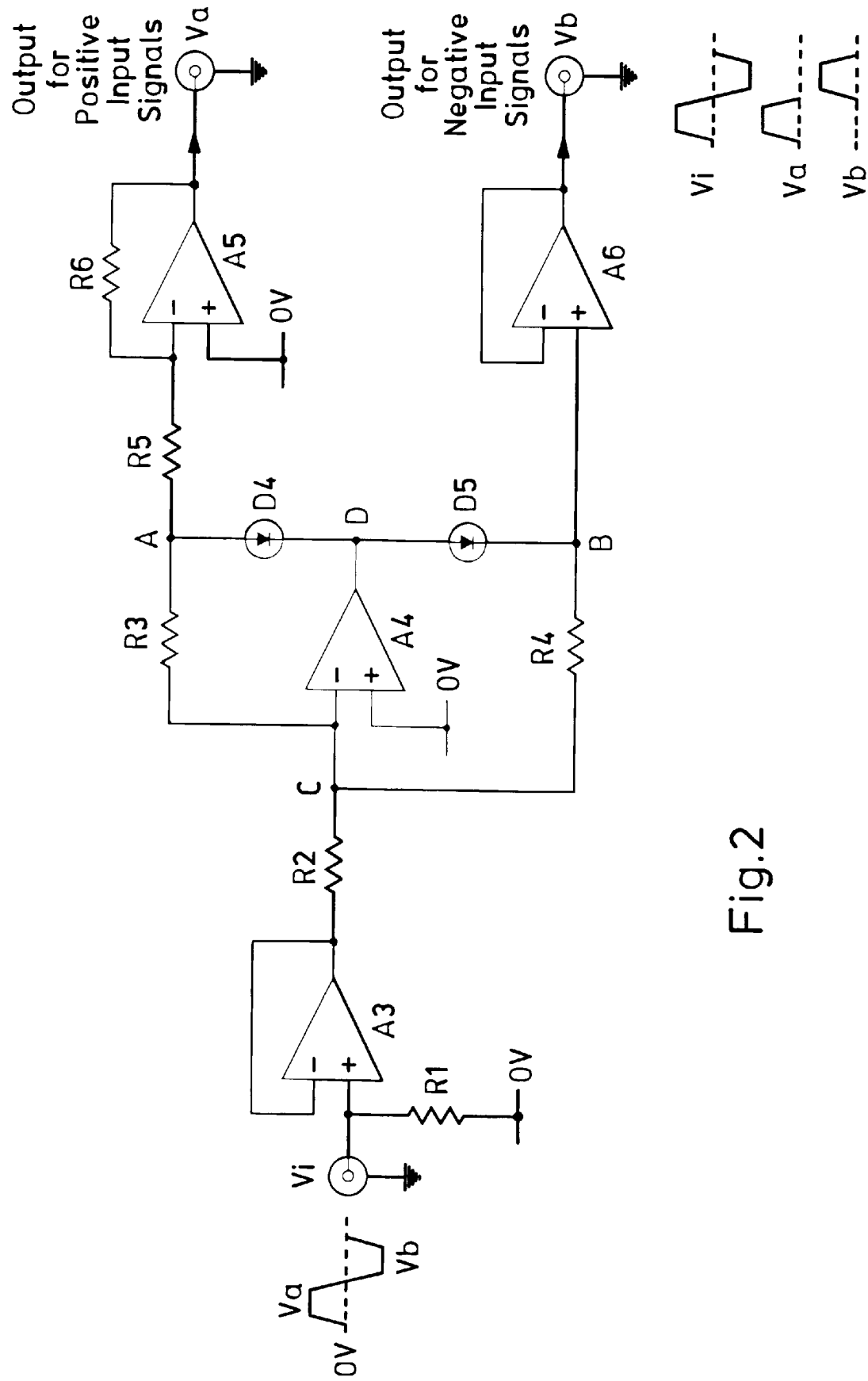
FIG. 2 is a circuit diagram for the precision rectifier of FIG. 1.

The output from the precision rectifier I is also applied to an opto-isolator and level shifting circuitry 3 via the switching logic 4 to control the switches S1 and S3, as will be explained. As may be seen in FIG. 2, the precision rectifier 1 accepts a reference waveform in the form of a bipolar input signal Vi from controlling equipment (not shown). The circuitry includes resistors R1, R2 and R6. This signal consists of a positive excursion Va and a negative excursion Vb. The amplifier A3 is a non-inverting buffer for the input signal and passes it to the virtual-earth amplifier A4. A positive input causes the output of A4 (node D) to go negative, forward biasing D4 and reverse biasing D5. The negative signal at node A is then inverted by amplifier A5 to give the positive output Va. At the same time the output Vb is zero because the input of amplifier A6 is held at the virtual-earth of A4 (node C) via resistor R4. A negative input causes the output of A4 to go positive, reverse biasing D4 and forward biasing D5. The positive signal at node B is then passed by the non-inverting amplifier A6 to give the positive output Vb. At the same time the output Va is zero because the input of A5 is held at the virtual-earth of A4 via R3 and R5.

Figure 3:
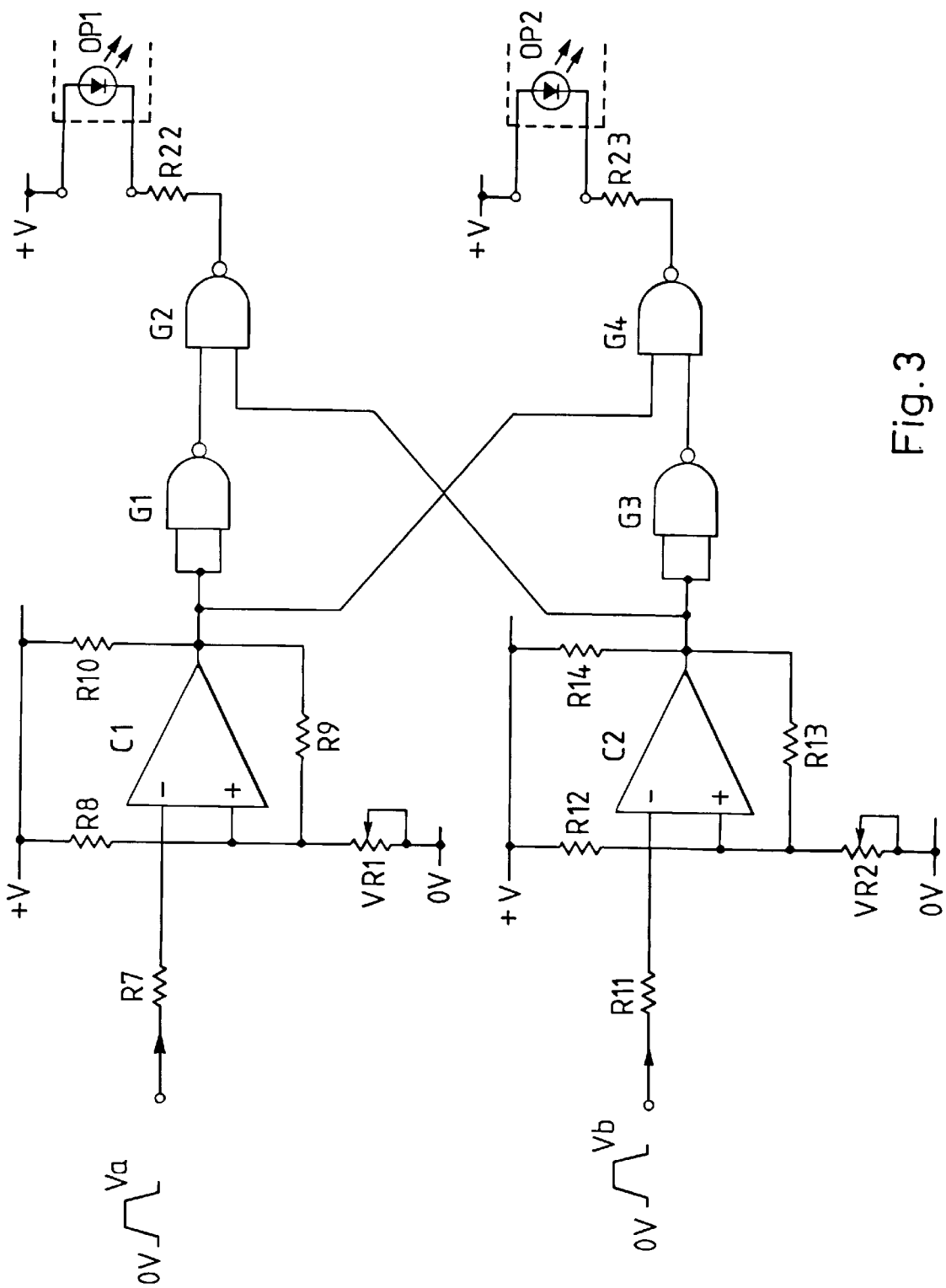
FIG. 3 is a circuit diagram for the switching logic of FIG. 1.
Figure 4:
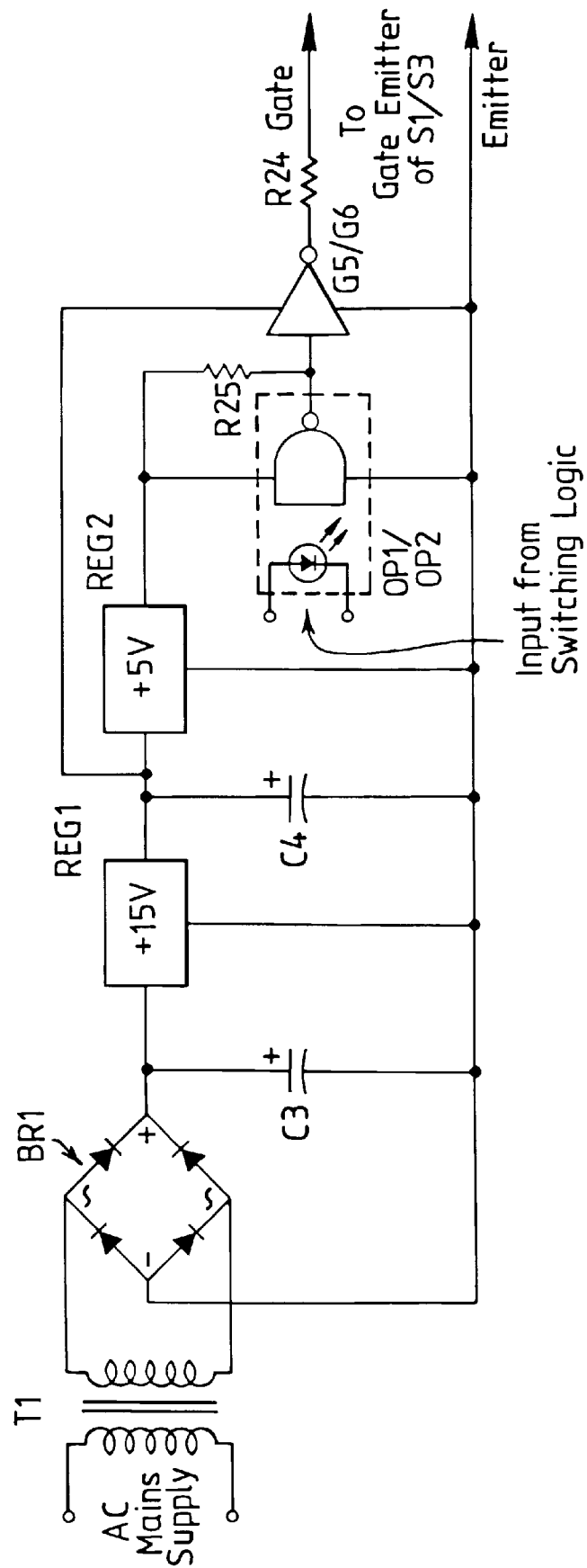
FIG. 4 is a circuit diagram for the opto-isolator and level shifting circuitry for switches S1 and S3 of FIG. 1.

For a positive-going input signal (Va) the switching logic causes switch S3 to become conductive (i.e. to close) and switch S1 to be non-conductive (i.e. open) via the opto-isolators and high voltage level shifting circuitry 3. The action of the 4 switching logic and opto-isolators and level shifter may be seen from FIGS. 3 and 4. The switching logic consists of two voltage comparators C1, C2 and four crossed coupled gates G1, G2, G3, G4. FIG. 3 also shows resistors R7, R8, R9, R10, R11, R12, R13, R14, R22, R23, R24 and R25. With both inputs Va, Vb at zero the output of both comparators is high due to a small voltage offset (set by VR1, VR2) on the positive input of C1, C2. With each output high the output of gates G2 and G4 is high and the light emitting diodes (l.e.d.) of each opto-coupler OP1, OP2 are switched off.

As input Va goes positive (Vb=0) the output of C1 goes low as the input passes through the switching threshold (approximately 10 mV) set by VR1. This causes the output of G1 to go high and the output of G2 to go low, switching on the l.e.d. of opto-coupler OP1. The output of C1 is also linked to one of the inputs of G4 ensuring that when C1 output is low the output of G4 is high, keeping the l.e.d. of OP2 off while OP1 is on.

Similarly when Va=0 and Vb goes positive the output of C2 goes low switching on the l.e.d. of opto-coupler OP2, with OP1 being held off via G2. The provision of crossed coupled gates ensures that both opto-couplers cannot be switched on at the same time.

Turning now to the opto-isolators and level shifter connected to switches S1 and S3, two identical circuits are required, only one of which is shown, one for each switch. Power for the circuit is derived from an a.c. mains supply via isolating transformer T1 which allows the whole circuit to float at the emitter potential of S1 or S3. Bridge diode BR1, reservoir capacitors C3, C4 and voltage regulators REG1, REG2 supply d.c. power to the optically-coupled gate OP1/OP2 and the final driving gate G5/G6. The l.e.d.s of OP1 and OP2 are integrally coupled into a logic gate, the output of which drives the input G5/G6 respectively. With the l.e.d.s off the output of the logic gate is high and the output of G5 or G6 is low, keeping switches S1/S3 off. As soon as the l.e.d. of OP1 or OP2 turns on, the output of the logic gate goes low causing the output of G5 or G6 to go high, which turns on switch S1 or S3.

On the fast rising edge of input Va, giving rise to switch S3 turning on and S1 turning off, the battery voltage (36–60V) is insufficient to ramp the current through the coil to match the input signal so the loop error signal of the current regulator S2, Rs1, A1 momentarily increases. This signal turns on in a linear manner the voltage controlling device S5 which applies a sufficiently high voltage to the coil from supply C. This voltage reduces the rise-time of the current through the coil. As soon as the current through S3, D3, S2, Rs1 and the coil matches the input, the error is eliminated and S5 becomes non-conductive (i.e. turns off) leaving the battery pack B to supply the current during the flat top of the gradient pulse via diode D1. This diode is in the circuit to protect the battery pack B from the high voltage when switch S5 is conductive.

On the falling edge of Va, the current regulator S2, Rs1, A1 starts to turn off and as a result the inductively stored energy in the gradient coil causes the voltage across the coil to rise rapidly to a value determined by the coil inductance and the ramp rate of the input signal. Diode D2 protects switch S1 from this voltage. When the input signal V1 is negative going the circuit operates in the same way except that Vb is now the control voltage signal for the current regulator comprising S4, Rs2, A2. The control signal Vb now causes switch S1 to close and switch S3 to open. Diode D3 protects switch S3 from the voltage generated by the falling edge of Vb.

It will thus be appreciated that the overall voltage applied to the gradient coil is controlled by voltage supply circuitry in the form of error detector 2, opto isolator/level shifter 3 and voltage controlling device 55. On the other hand, the overall current supplied to the gradient coil is controlled by current supply circuitry in the form of a four arm bridge which provides current reversal as well as current regulation. Current regulation is achieved through the current controlling devices S2 and S4 in conjunction with their error amplifier circuits A1 and A2 and the current sense resistors Rs1 and Rs2, whilst current reversal is achieved through appropriate switching of switches S1 and S3 as well as devices S2 and S4. Hence the devices S2 and S4 serve a dual purpose.

The battery specification for this system has to take into account the voltage needed to overcome the resistive drop across the coil (Rg) during the flat top of the gradient pulse and also the voltage drop across D1, S1, S4 (S2, S3), D2 (D3) and Rs2 (Rs1). There must also be sufficient voltage across S4 (S2) to bias it in the linear part of its characteristic. With the above described components in the system and a coil resistance of 0.1 ohm a voltage of 36V (3*12V batteries) met the requirements when pulsing the coil with 100 amps. This was achieved using 63A/hr lead-acid automotive batteries.

Figure 6:
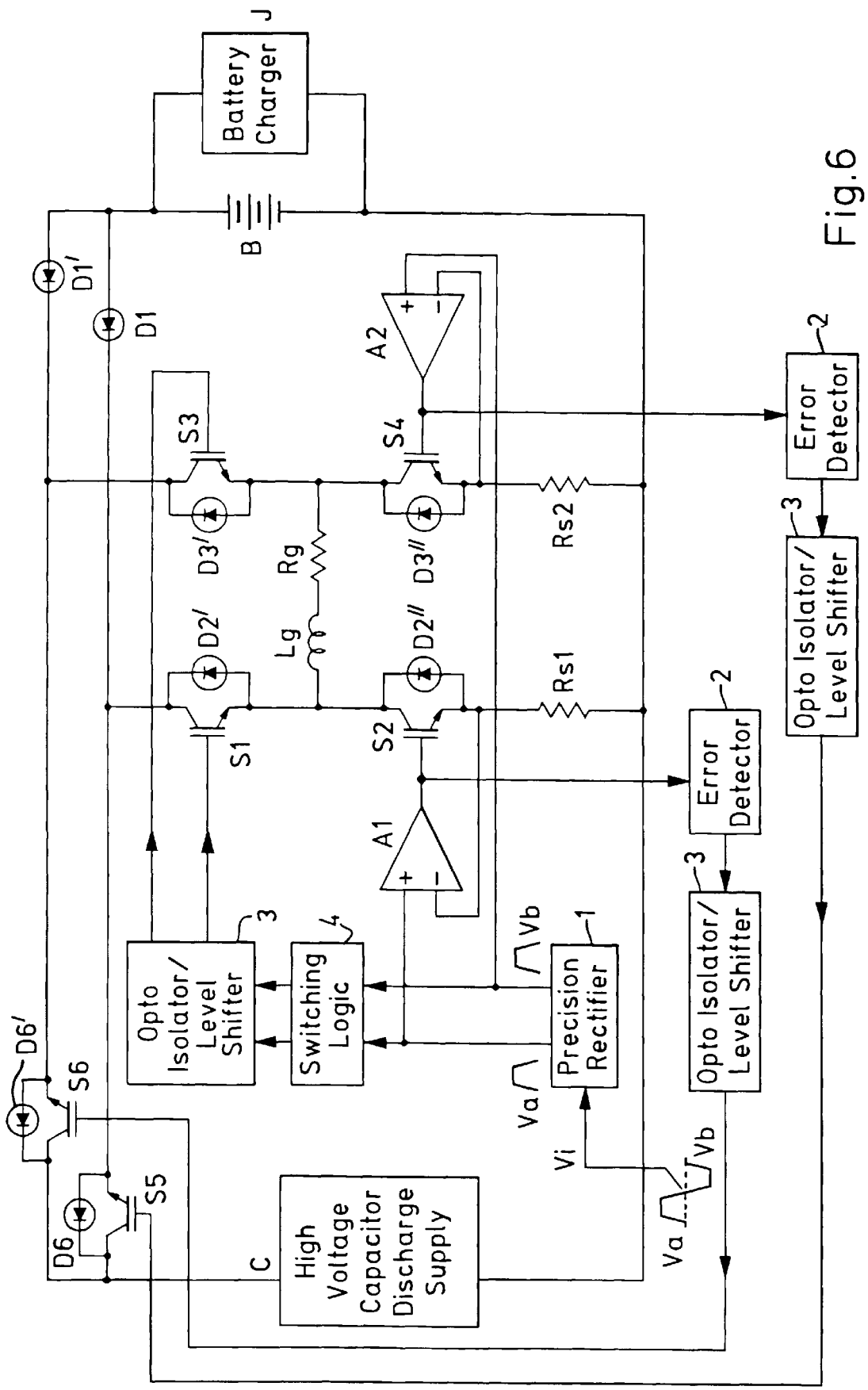
FIG. 6 is a block diagram of a second embodiment of a gradient drive system according to the invention.

An alternative embodiment of gradient drive system is illustrated in FIG. 6. This embodiment is similar to the one shown in FIG. 1. Therefore, like reference numerals denote like components. For reasons of simplicity, only those parts of the embodiment shown in FIG. 6 will described in detail where it differs from the embodiment shown in FIG. 1.

In FIG. 6, current for the drive pulses is again supplied from two sources (the battery supply and the high voltage supply); however, in this embodiment this is done separately for each arm of the bridge, via diode D1 and switch S5 for current flowing through S1 and S4, and via diode D1' and switch S6 for current flowing through S3 and S2. The circuitry includes precision rectifier 1, resistors Rs1 and Rs2, inductance Lg, resistance Rg, optoisolator/level shifter 3, switching logic 4 and voltages Vi, Va and Vb. The respective outputs from the amplifier circuits A1 and A2 are passed to the controlling gates of error detectors 2 which, via opto-isolators and level shifting circuitry 3, control voltage controlling devices S6 and S5 respectively. Diodes D2', D2", D3', D3", D6 and D6' are shown in FIG. 6 respectively connected across devices S1, S2, S4, S3, S5 and S6 in reverse parallel configuration. Whilst these diodes are shown separately to their respective devices, in fact they form an inherent part of the devices as manufactured; they are sometimes referred to as "parasitic diodes". These diodes are not shown explicitly in FIG. 1 because they are not used. With the arrangement shown in FIG. 6, during that part of the cycle during which the magnetic field generated by the coil is being reduced, energy from the gradient coil can be recovered, because either the diodes D2', D3" and D6 or D2", D3' and D6' allow a current to flow back to the high voltage capacitor, where the energy is stored.

Both embodiments could be modified such that the system would be modular with the basic module delivering 100 amps. Systems of 200 or 300 amps could then be configured with the same circuit topology simply by paralleling additional semiconductor devices. Calculations show that a 200 amp driver would require a source voltage of 48V (4*12V batteries) and a driver of 300 amps would require 60V (5*12V batteries). At the higher currents the increased voltage is mainly required to overcome the voltage drop across the coil since the voltage drop across the other components hardly changes. This results in the system becoming more efficient at higher power levels.

The choice of battery capacity will depend on the current drawn and the duty cycle of the pulse sequence used but it is envisaged that batteries in the range 100–200 Ahr. would be used, since such batteries can supply pulsed currents well in excess of 300 amps. The Ahr. capacity of a battery is not a constant parameter but depends on many factors including the nature of discharge with respect to time (the capacity is greater when the battery is discharged intermittently or pulsed than if it is discharged continuously). In a proposed system the battery pack would be on a permanent 24 hr charge at a rate to replenish the charge consumed during a typical working day. Preferably a current limited switch-mode charger would be used since it can deliver a high charging current with good efficiency from a single phase supply.

The voltage required for a fast rising gradient pulse will depend on the actual inductance of the coil Lg and the current required in the time [V=L(di/dt)]. With the circuit described this voltage can easily be selected by varying the AC supply (through transformer tappings not shown) to the capacitor discharge supply C. The main limitation to this voltage will be the voltage rating of the semiconductor devices.

Technical Applicability

There has been described a gradient drive system which it is believed offers the following advantages over conventional amplifier systems:

1. Versatile, modular design enabling current/voltage combination to be easily changed to suit different loads and performance requirements.
2. It is able to deliver high current pulses using only a single phase supply and does not present an adverse power factor to the public electricity supply.
3. Suitable for mobile MR installations where the batteries can be stowed remotely from the controlling electronics to maximise the use of available space. Also, because high currents are not drawn from the mains supply, no special generators are required.
4. Suitable for very low resistance gradient coils of the type manufactured from sheet copper where conventional amplifiers can over-dissipate their output transistors.

5. Considerable cost savings over conventional amplifier systems.

It will of course be understood that different components and circuitry from those described may be implemented in the gradient drive system without departing from the spirit and scope of the invention.

What is claimed is:

1. A gradient drive system for delivering current pulses to an MRI gradient coil, comprising;
   a high voltage supply for the gradient coil;
   an input arranged to receive said high voltage supply for the gradient coil;
   a low voltage battery supply for the gradient coil; and
   high voltage supply control circuitry coupled to said input for controlling the connection of the high voltage supply to the gradient coil dependent on the current supplied to the gradient coil.

2. A gradient drive system as claimed in claim 1, wherein the battery supply comprise at least one rechargeable battery.

3. A gradient drive system as claimed in claim 1 further comprising current supply control circuitry, coupled to the battery supply and the high voltage supply control circuitry, for controlling supply of current to the gradient coil in response to control signals representing desired current from through the gradient coil.

4. A gradient drive system as claimed in claim 3, further comprising control signal generating circuitry for generating said control signals representing the desired current flow through the gradient coil.

5. A gradient drive system as claimed in claim 3, wherein said high voltage supply control circuitry comprises voltage supply control circuitry for controlling the connection of said high voltage supply to said current supply control circuitry so that said high voltage supply is isolated from said current supply control circuitry when the supply of current from said current supply control circuitry is substantially equal to the desired current flow.

6. An MRI gradient drive system, comprising;
   a high voltage supply for a gradient coil;
   an input arranged to receive said high voltage supply for said gradient coil;
   control signal generating circuitry for generating control signals representing desired current flow through said gradient coil;
   current supply control circuitry connected to said control signal generating circuitry for controlling supply of current to said gradient coil in response to said control signals,
   a low voltage battery supply connected to said current supply control circuitry; and
   voltage supply control circuitry connected to said high voltage supply for controlling connection of said high voltage supply to said current supply control circuitry whereby said voltage supply control circuitry is arranged to isolate said high voltage supply from said current supply control circuitry when the supply of current as determined by said current supply circuitry is substantially equal to the desired current flow.

7. A gradient drive system as claimed in claim 3, wherein said current supply control circuitry includes at least one current regulator for sensing the flow of current through said gradient coil and for determining whether the sensed current flow corresponds to the desired current flow.

8. A gradient drive system as claimed in claim 7, wherein said at least one current regulator comprises a current controlling device, a resistive element and an error amplifier the current controlling device being arranged to determine the flow of current through said gradient coil as a measure of the voltage across said resistive element and the error amplifier being arranged to compare the sensed current flow with said control signals from said control signal generating circuitry and to generate an error output when a difference between the sensed current flow and said control signals is determined.

9. A gradient drive system as claimed in claim 3, wherein said current supply control circuitry further includes current reversal circuitry for reversing the supply of current to said gradient coil.

10. A gradient drive system as claimed in claim 9, wherein said current reversal circuitry is in the form of a four arm bridge circuit for connection across said gradient coil.

11. A gradient drive system as claimed in claim 10, wherein said four arm bridge circuit comprises two switches and two restive current regulators for sensing the flow of current through said gradient coil and for determining whether the sensed current flow corresponds to the desired current flow.

12. A gradient drive system as claimed in claim 5, wherein said current supply control circuitry includes at lean one current regulator for sensing the flow of current through said gradient coil and for determining whether the sensed current flow corresponds to the desired current flow and said voltage supply control circuitry includes an error or detector for detecting when the sensed current flow is not equal to the desired current flow and a voltage controlling device connected to said error detector and operable to connect said high voltage supply to said curt supply control circuitry when an error is detected.

13. A gradient drive system as claimed in claim 12, wherein said voltage controlling device is a power MOSFET.

14. A gradient drive system as claimed in claim 12, wherein said voltage controlling device is an IGBT.

15. A gradient drive system as claimed in claim 5, wherein said voltage supply control circuitry further includes a diode bet said battery supply and said current supply control circuitry for isolating said battery supply from said current supply control circuitry when said high voltage supply is connected.

16. A gradient drive system as claimed in claim 1, further comprising means for isolating the battery supply from the high voltage supply.

17. A gradient drive system as claimed in claim 4, wherein said control signals generated by said control signal generating Ames have substantially a trapezoidal waveform.

18. A gradient drive system as claimed in claim 4, wherein said control signals generated by said control signal generating means have substantially a sinusoidal waveform.

19. A gradient dive system as claimed in claim 5, wherein said voltage supply control circuitry comprises a voltage controlling device whereby said high voltage supply is isolated by means of the voltage controlling device from said current supply control circuitry when the current supplied to said gradient coil is substantially equal to the desired current flow.

20. A gradient drive system as claimed in claim 5, wherein said voltage supply control circuitry is connected to said high voltage supply and said battery supply for controlling the connection of said voltage supplies to said current supply control circuitry whereby when the current flowing through said gradient coil is substantially equal to the desired current flow only said battery supply is connected to said current supply control circuitry.

21. A gradient drive system for a gradient coil, comprising: an input for receiving a power supply for the gradient coil; and
   means coupled to said input for reversing the supply of current to the gradient coil;
   wherein said current reversal means comprises a four arm bridge circuit for connection across the gradient coil, said four arms of said bridge circuit are constituted respectively by two switches for current reversal, and two current regulators for regulating the flow of current through the gradient coil, wherein said bridge circuit is configured such that the two current regulators are arranged to perform the dual function of current regulation and reversal.

22. A gradient drive system as claimed in claim 11, wherein said switches are semiconductor devices ad each of said current regulators also includes at least one semiconductor device.

23. A gradient drive system as claimed in claim 22, wherein said switches ar, power MOSFETs and each of said current regulators also includes at least one power MOSFET.

24. A gradient drive system as claimed in claim 22, wherein said switches are IGBTs and each of said current regulators also includes at least one IGBT.

25. A gradient drive system as claimed in claim 11, wherein each current regulator comprises a current controlling device, a resistive element and an error amplifier, the error amplifier being arranged to compare the current through the gradient coil as a measure of the voltage across said resistive element with a desired current flow through the gradient coil and to generate an error output when a difference is determined, the current controlling device being arranged to control the flow of current through the gradient coil dependent on the error output.

26. A gradient drive system as claimed in claim 11, wherein a first terminal of each switch is coupled to a first terminal of the input and a first terminal of each current regulator is coupled to a second terminal of the input, and a second terminal of each switch is coupled to a second terminal of its respective current regulator as well as being for coupling to a respective terminal of the gradient coil.

27. A gradient drive system as claimed in claim 1, further comprising means for storing electrical energy recovered from the gradient coil.

28. An MRI system including a gradient drive system as claimed claim 3, wherein there is further provided a gradient coil connected to said current supply control circuitry.

29. An MRI system including d gradient drive system as claimed in claim 1, further comprising the gradient coil.

30. A gradient drive system comprising
   a high voltage supply;
   a gradient coil;
   control signal generating circuitry for generating control signals representing a desired current flow through said gradient coil;
   current supply control circuitry connected to said control signal generating circuitry and said gradient coil for controlling the supply of current to said gradient coil in response to said control signals;
   a low voltage battery supply; and
   voltage supply control circuitry connected to said high voltage supply and said low voltage battery supply for controlling the connection of said voltage supplies to said current supply control circuitry, wherein said voltage supply control circuitry comprises a voltage controlling device arranged to isolate said high voltage supply from said current supply control circuitry when the current supplied to said gradient coil is substantially equal to the desired current flow.

31. A gradient drive system comprising a high voltage supply;
   a gradient coil;
   control signal generating circuitry for generating control signals representing a desired current flow through said gradient coil;
   current supply control circuitry connected to said control signal generating circuitry and said gradient coil for controlling the supply of current to said gradient coil in response to said control signals;
   a low voltage battery supply; and
   voltage supply control circuitry connected to said high voltage supply and said low voltage battery supply for controlling the connection of said voltage supplies to said current supply control circuitry, whereby when the current flowing through said gradient coil is substantially equal to the desired current flow only said low voltage battery supply is connected to said current supply control circuitry.

* * * * *